(12) United States Patent
   Wu

(10) Patent No.: US 12,213,245 B2
(45) Date of Patent: Jan. 28, 2025

(54) RESILIENT SUBSTRATE STRUCTURE AND ELECTRONIC DEVICE HAVING THE SAME

(71) Applicant: PanelSemi Corporation, New Taipei (TW)

(72) Inventor: Yi-Hua Wu, New Taipei (TW)

(73) Assignee: PANELSEMI CORPORATION, New Taipei (TW)

( * ) Notice: Subject to any disclaimer, the term of this patent is extended or adjusted under 35 U.S.C. 154(b) by 194 days.

(21) Appl. No.: 18/170,976

(22) Filed: Feb. 17, 2023

(65) Prior Publication Data

US 2023/0269869 A1    Aug. 24, 2023

(30) Foreign Application Priority Data

Feb. 18, 2022  (TW) .................................. 111106088
Feb. 15, 2023  (TW) .................................. 112105461

(51) Int. Cl.
   *H05K 1/02*    (2006.01)
   *H05K 1/18*    (2006.01)

(52) U.S. Cl.
   CPC .............. *H05K 1/028* (2013.01); *H05K 1/189* (2013.01); *H05K 2201/051* (2013.01); *H05K 2201/10128* (2013.01)

(58) Field of Classification Search
   CPC .. H05K 1/028; H05K 1/189; H05K 2201/051; H05K 2201/10128
   See application file for complete search history.

(56) References Cited

U.S. PATENT DOCUMENTS

| | | | |
|---|---|---|---|
| 10,602,623 B1* | 3/2020 | Myers | G06F 1/1652 |
| 2011/0043976 A1* | 2/2011 | Visser | G09F 9/301 |
| | | | 361/679.01 |
| 2014/0362512 A1* | 12/2014 | Hinson | G06F 1/1601 |
| | | | 361/679.21 |
| 2016/0100478 A1* | 4/2016 | Lee | G06F 1/1624 |
| | | | 361/749 |
| 2016/0192474 A1* | 6/2016 | Niskala | B29C 51/14 |
| | | | 361/679.55 |
| 2016/0239050 A1* | 8/2016 | Kim | G06F 1/1652 |
| 2017/0318688 A1* | 11/2017 | Kim | H05K 5/0017 |
| 2021/0068280 A1* | 3/2021 | Han | G09F 9/335 |
| 2021/0315134 A1* | 10/2021 | Feng | H05K 7/20972 |
| 2022/0104369 A1* | 3/2022 | Yao | H04M 1/0268 |

(Continued)

*Primary Examiner* — Hoa C Nguyen
(74) *Attorney, Agent, or Firm* — Muncy, Geissler, Olds & Lowe, P.C.

(57) ABSTRACT

A resilient substrate structure, which can be rolled up around an axis, includes a substrate, a working patterned layer and a resilient structure. The substrate has a first surface and a second surface. The substrate is defined with a first edge and a second edge in a direction parallel to the axis. The working patterned layer is arranged on the substrate. The resilient structure is arranged on the second surface. The resilient structure includes a composite layer and a supporting layer, which keep attaching to each other. The composite layer has curve-able segments, each of which is parallel to the axis and connects to the first and second edges. The resilient structure is transformed to contain multiple wavy segments when the resilient substrate structure is at the retraction state. An electronic device including the resilient substrate structure and electronic elements is also disclosed.

19 Claims, 11 Drawing Sheets

(56) References Cited

U.S. PATENT DOCUMENTS

| | | | |
|---|---|---|---|
| 2022/0124920 A1* | 4/2022 | He | H10K 77/111 |
| 2022/0386485 A1* | 12/2022 | Dong | H05K 5/0217 |
| 2023/0288963 A1* | 9/2023 | Choi | G06F 1/1652 |

* cited by examiner

RESILIENT SUBSTRATE STRUCTURE AND ELECTRONIC DEVICE HAVING THE SAME

CROSS REFERENCE TO RELATED APPLICATIONS

This Non-provisional application claims priority under 35 U.S.C. § 119(a) on Patent Application No. 111106088 filed in Taiwan, Republic of China on Feb. 18, 2022, and Patent Application No. 112105461 filed in Taiwan, Republic of China on Feb. 15, 2023, the entire contents of which are hereby incorporated by reference.

BACKGROUND

Technology Field

The present disclosure relates to a resilient substrate structure and, in particular, to a resilient substrate structure with a composite structure design.

Description of Related Art

In recent years, the resilient display technology has gradually become an important research and development trend of display technology due to the resilient display products have advantages of light and thin structure, rollable, portable, small size and good impact resistance. However, since the resilient display device has relatively weaker external force resistance, when the resilient display device is excessively bent or frequently bent excessively, the part of the resilient display device that bears the most stress is prone to permanent deformation and may be separated or dislocated from other structures, thereby damaging the overall mechanical structure or electrical performance of the resilient display device.

Therefore, it is desired to provide a resilient display device that can maintain the bendability and structural stability at the same time.

SUMMARY

This disclosure provides a resilient display device that can maintain the bendability and structural stability at the same time.

One or more exemplary embodiments of this disclosure provide a resilient substrate structure, in which the resilient substrate structure is rollable around an axis, is configured to extend from or retract onto the axis, and rolls between a retraction state and an extension state. The resilient substrate structure defining a longitudinal direction perpendicular to the axis while rolls in the extension state, the resilient substrate structure defining a radial direction perpendicular to the axis while rolls in the retraction state. The resilient substrate structure includes a substrate, a working patterned layer and a resilient structure. The substrate has a first surface and a second surface opposite to each other. The substrate is defined with a first edge and a second edge in a direction parallel to the axis, and the second edge is opposite to the first edge. The working patterned layer is arranged on the substrate. The resilient structure is arranged on the second surface of the substrate. The resilient structure includes a supporting layer and a composite layer kept attaching to each other, in which the composite layer locates between the supporting layer and the substrate. The resilient structure defines a cross-sectional profile in the longitudinal direction. The resilient structure defines a cross-sectional profile in the longitudinal direction, and the cross-sectional profile of the resilient structure defines a plurality of wavy segments, while the resilient substrate structure rolls in the retraction state.

In one exemplary embodiment, the composite layer has a plurality of curve-able segments, and each of the curve-able segments is parallel to the axis and connects to the first edge and the second edge of the substrate.

In one exemplary embodiment, the composite layer defines a plurality of weak-transform segments and one or more strong-transform segments connecting to the weak-transform segments, the weak-transform segments and the one or more strong-transform segments are arranged in co-layer on the second surface of the substrate, the weak-transform segments are in a continual arrangement in the longitudinal direction.

In one exemplary embodiment, the supporting layer defines a minimum anti-deformation stress in the longitudinal direction exists as the resilient substrate structure is in the retraction state, and a maximum anti-deformation stress in the longitudinal direction exists as the resilient substrate structure is in the extension state.

In one exemplary embodiment, the supporting layer defines a non-linear elastic coefficient.

One or more exemplary embodiments of this disclosure provide a resilient substrate structure including a substrate, a working patterned layer and a resilient structure. The resilient substrate structure is rollable around an axis, so that the resilient substrate structure has a retraction state and an extension state. The resilient substrate structure defines a longitudinal direction perpendicular to the axis when the resilient substrate structure is at the extension state, and defines a radial direction perpendicular to the axis when the resilient substrate structure is at the retraction state. The substrate has a first surface and a second surface opposite to each other. The substrate is defined with a first edge and a second edge in a direction parallel to the axis, and the second edge is opposite to the first edge. The working patterned layer is arranged on the substrate. The resilient structure is arranged on the second surface of the substrate. The resilient structure includes a supporting layer and a composite layer located between the supporting layer and the substrate. The composite layer and the supporting layer keep attaching to each other. The supporting layer defines a non-linear elastic coefficient.

In one exemplary embodiment, when the resilient substrate structure is at the extension state, the supporting layer has a stress shrunk in a direction in the longitudinal direction, and when the resilient substrate structure is at the retraction state, the supporting layer has a stress release in the direction in the longitudinal direction.

One or more exemplary embodiments of this disclosure provide a resilient substrate structure including a substrate, a working patterned layer and a resilient structure. The resilient substrate structure is rollable around an axis, so that the resilient substrate structure has a retraction state and an extension state. The resilient substrate structure defines a longitudinal direction perpendicular to the axis when the resilient substrate structure is at the extension state, and defines a radial direction perpendicular to the axis when the resilient substrate structure is at the retraction state. The substrate has a first surface and a second surface opposite to each other. The substrate is defined with a first edge and a second edge in a direction parallel to the axis, and the second edge is opposite to the first edge. The working patterned layer is arranged on the substrate. The resilient structure is arranged on the second surface of the substrate. The resilient structure includes a supporting layer and a composite layer located between the supporting layer and the substrate. The composite layer and the supporting layer keep attaching to each other. The composite layer has a plurality of curve-able segments, and each of the curve-able segments is parallel to the axis and connects to the first edge and the second edge of the substrate. The resilient structure defines a cross-sectional profile in the longitudinal direction. When the resilient substrate structure is at the retraction state, the cross-sectional profile of the resilient structure contains a plurality of wavy segments.

In one exemplary embodiment, the working patterned layer is located at or close to a stress neutral axis of the resilient substrate structure.

In one exemplary embodiment, the resilient substrate structure further includes a resilient layer connected to the first surface of the substrate.

In one exemplary embodiment, the composite layer defines a plurality of weak-transform segments and one or more strong-transform segments interlacing the weak-transform segments, the weak-transform segments and the one or more strong-transform segments are arranged in co-layer on the second surface of the substrate, and the weak-transform segments are in a continual arrangement in the longitudinal direction. When the resilient substrate structure rolls in the retraction state, the deformation of the weak-transform segments in the radial direction is less than the deformation of the one or more strong-transform segments in the radial direction. Each of the curve-able segments forms at least partial of the one or more strong-transform segments.

In one exemplary embodiment, in the cross-sectional profile, a plurality of the strong-transform segments are provided, and any adjacent two of the strong-transform segments are joined with one of the weak-transform segments therebetween.

In one exemplary embodiment, the weak-transform segments are in a continual arrangement in a direction parallel to the axis.

In one exemplary embodiment, the weak-transform segments define a thickness, and the thickness keeps constant.

In one exemplary embodiment, the composite layer is defined with a first edge and a second edge in a direction parallel to the axis. Each of the strong-transform segments and the weak-transform segments extends from the first edge to the second edge, and the strong-transform segments and the weak-transform segments are parallel to each other.

In one exemplary embodiment, the composite layer is defined with a first edge and a second edge in a direction parallel to the axis. At least a part of the weak-transform segments are in a continual arrangement between the first edge and the second edge in a direction parallel to the axis, and at least a part of the strong-transform segments are in a continual arrangement in the longitudinal direction.

In one exemplary embodiment, the composite layer includes a first material and a second material, and each of the first material and the second material is defined with a viscoelasticity and a yield point. The viscoelasticity of the first material is less than the yield point of the first material, the viscoelasticity of the second material is less than the yield point of the second material, and the viscoelasticity of the first material is less than the viscoelasticity of the second material. The weak-transform segments include the first material or include the first material and the second material, and the strong-transform segments include the second material or include the first material and the second material.

In one exemplary embodiment, the weak-transform segments define a thickness, and when the resilient substrate structure is either at the retraction state or at the extension state, the thickness keeps constant.

In one exemplary embodiment, when the resilient substrate structure is at the extension state, a tensile resistance of the supporting layer in the longitudinal direction is greater than a tensile resistance of the working patterned layer in the longitudinal direction.

In one exemplary embodiment, the substrate is defined with a first edge and a second edge in a direction parallel to the axis, and the supporting layer is defined with a first edge and a second edge in the direction parallel to the axis. When the resilient substrate structure is at the retraction state, the first edge and the second edge of the supporting layer are leveled with the first edge and the second edge of the substrate, respectively.

In one exemplary embodiment, when the resilient substrate structure is at the retraction state, a bendability of the supporting layer is greater than a bendability of the working patterned layer.

In one exemplary embodiment, a material of the supporting layer includes a non-woven fabric.

In one exemplary embodiment, the supporting layer defines a first thickness corresponding to the weak-transform segments and a second thickness corresponding to the strong-transform segments, and the first thickness is greater than the second thickness.

In one exemplary embodiment, the supporting layer is defined with a plurality of weak-curveable segments corresponding to the weak-transform segments and one or more strong-curveable segments corresponding to the one or more of the strong-transform segments. A bendability of the weak-curveable segments is less than a bendability of the one or more strong-curveable segments.

In one exemplary embodiment, the supporting layer is defined with a plurality of weak-curveable segments corresponding to the weak-transform segments and one or more strong-curveable segments corresponding to the one or more of the strong-transform segments, and a hardness of the weak-curveable segments is greater than a hardness of the one or more strong-curveable segments.

In one exemplary embodiment, a plurality of weak-transform segments are provided, the supporting layer is defined with a plurality of weak-curveable segments corresponding to the weak-transform segments and a plurality of strong-curveable segments corresponding to the strong-transform segments. The supporting layer is defined with a first edge and a second edge in a direction parallel to the axis, and the weak-curveable segments extend from the first edge to the second edge.

In one exemplary embodiment, the weak-curveable segments are a plurality of sustaining ribs, the strong-curveable segments include a plurality of sustaining wires connecting the sustaining ribs, and a bendability of the sustaining wires is greater than a bendability of the sustaining ribs.

One or more exemplary embodiments of this disclosure provide a resilient substrate structure, in which the resilient substrate structure is rollable around an axis, is configured to extend from or retract onto the axis, and rolls between a retraction state and an extension state. The resilient substrate structure defining a longitudinal direction perpendicular to the axis while rolls in the extension state, the resilient substrate structure defining a radial direction perpendicular to the axis while rolls in the retraction state. The resilient substrate structure includes a substrate, a working patterned layer and a resilient structure. The substrate has a first surface and a second surface opposite to each other. The substrate is defined with a first edge and a second edge in a direction parallel to the axis, and the second edge is opposite to the first edge. The working patterned layer is arranged on the substrate. The resilient structure is arranged on the second surface of the substrate and defines a non-linear elastic coefficient.

In one exemplary embodiment, the resilient structure defines a stress shrunk in the longitudinal direction while the resilient substrate structure rolls in the extension state, and the resilient structure has a stress released in the longitudinal direction while the resilient substrate structure rolls in the retraction state.

One or more exemplary embodiments of this disclosure provide an electronic device, which includes a plurality of electronic elements and any of the above-mentioned resilient substrate structures. The electronic elements are arranged on the substrate and electrically connected to the working patterned layer.

In one exemplary embodiment, the working patterned layer and the electronic elements are arranged on the first surface of the substrate.

In one exemplary embodiment, the resilient layer covers at least a part of each of the electronic elements.

As mentioned above, the resilient substrate structure of this disclosure has good structural stability and still maintains the bendability, so that it can reduce the risk of structural separation or dislocation.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1A:
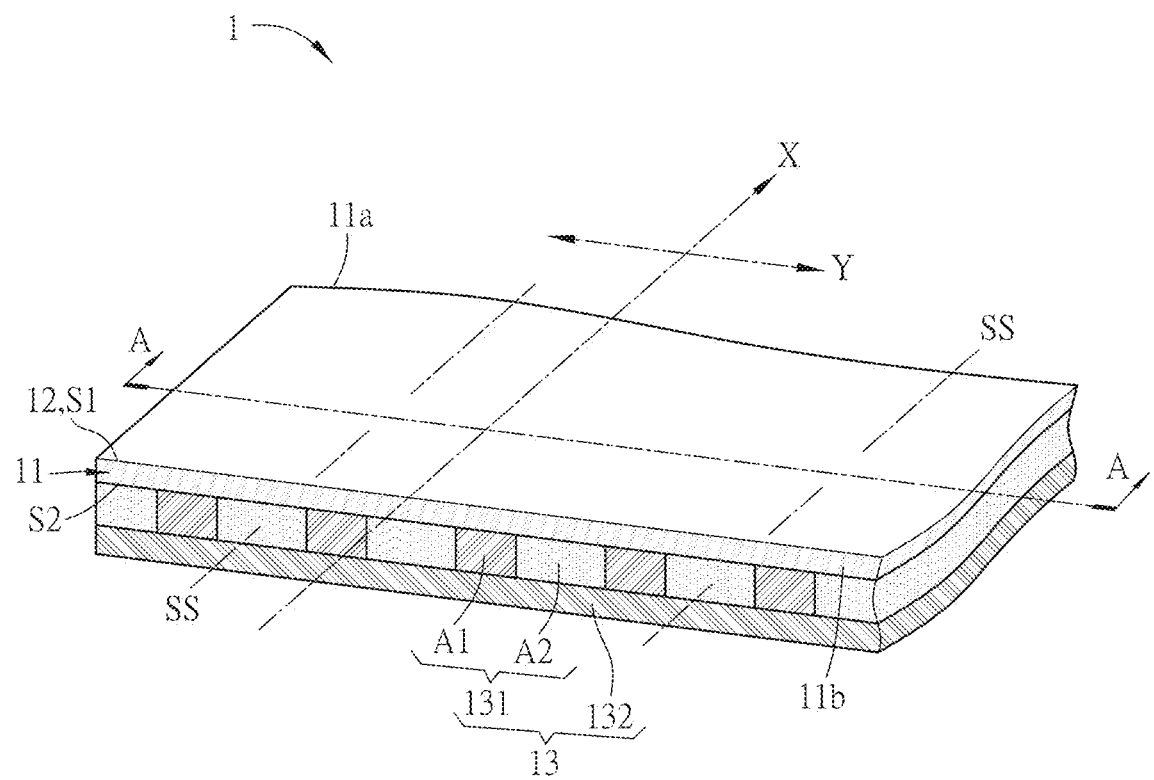
FIG. 1A is a schematic diagram showing a resilient substrate structure according to a first embodiment of this disclosure.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

It should be noted that although each embodiment of the present disclosure represents a combination of disclosed elements in a certain possible situation, the present disclosure can still be interpreted as including all possible combinations of disclosed elements. For example, if one embodiment includes components A, B and C, and the second embodiment includes components B and D, even if it is not explicitly disclosed, the present disclosure shall at least cover multiple embodiments including any combinations of A, B, C and D, or embodiments that are further permuted and combined with other elements. The use of ordinal numbers such as "first" and "second" is for illustrative purposes only, and does not indicate or imply relative order or importance, and does not imply the number of indicated technical features. In the description of the present disclosure, unless otherwise stated, the meaning of "plurality" includes two or more than two. The term "comprise", "include" and any synonyms thereof, unless otherwise stated, cover the non-exclusive inclusions. The spatially relative terms "upper", "lower", "left", "right", "horizontal", "vertical" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. The terms "connect" and any synonyms thereof, unless otherwise stated, include both direct and indirect connections. The term "stress neutral axis (layer)" refers to the boundary between the tension zone and the compression zone of a structure when the structure is bent, and the part of the structure located at the stress neutral axis (layer) is neither compressed nor tensioned. In other words, the normal stress on each point on the stress neutral axis (layer) is zero. The term "continual", unless otherwise stated, means that two adjacent points (segments, parts or synonyms) are separated and independent from each other, but multiple points form a straight line or line segment, so the structure includes both discontinuous and continuous characteristics.

Figure 1B:
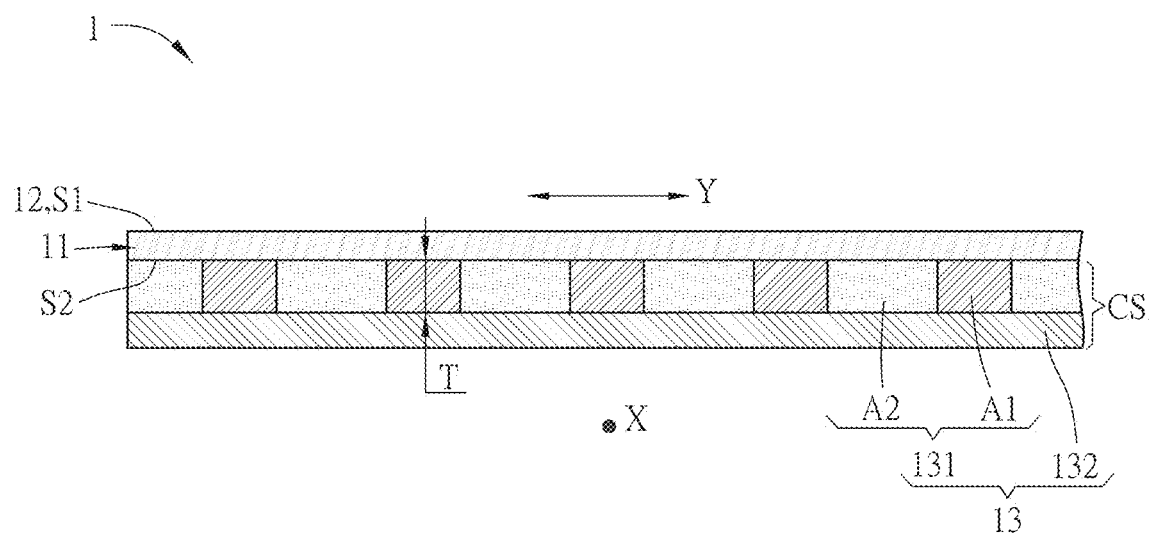
FIG. 1B is a sectional view of the resilient substrate structure of FIG. 1A in the line A-A, wherein the resilient substrate structure is at an extension state.
Figure 1C:
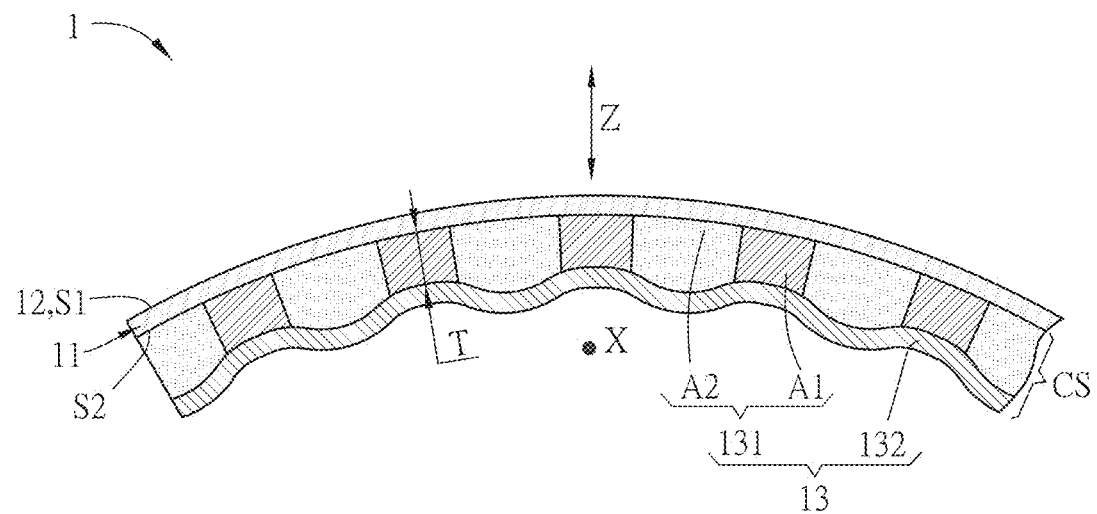
FIG. 1C is a sectional view of the resilient substrate structure as shown in FIG. 1B, wherein the resilient substrate structure is at a retraction state.
Figure 1D:
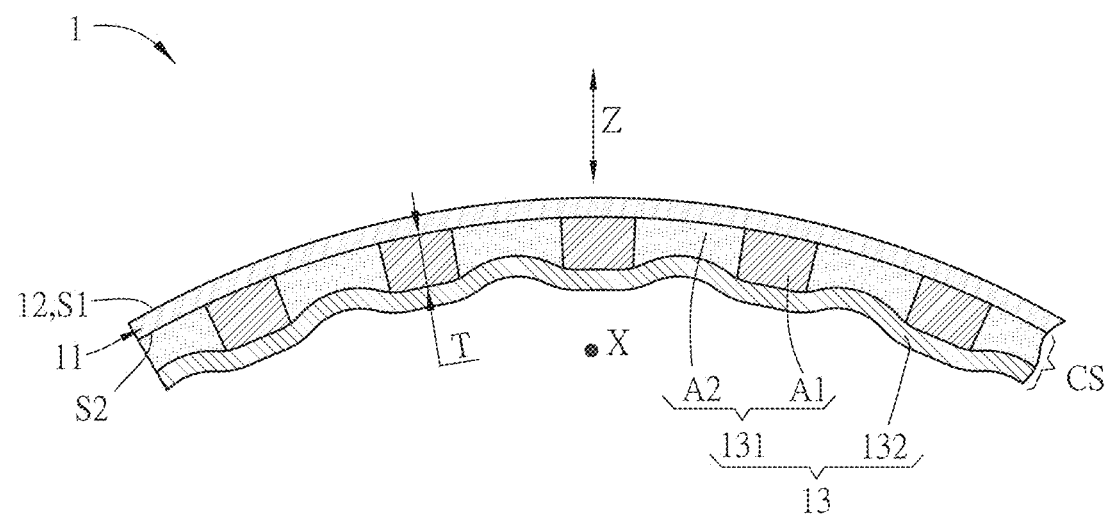
FIG. 1D is another sectional view of the resilient substrate structure as shown in FIG. 1B, wherein the resilient substrate structure is at a retraction state.

FIG. 1A is a schematic diagram showing a resilient substrate structure according to a first embodiment of this disclosure, FIG. 1B is a sectional view of the resilient substrate structure, which is at an extension state, of FIG. 1A in the line A-A, FIG. 1C is a sectional view of the resilient substrate structure, which is at a retraction state, as shown in FIG. 1B, and FIG. 1D is another sectional view of the resilient substrate structure, which is at a retraction state, as shown in FIG. 1B. The resilient substrate structure 1 is a resilient structure that can be optionally rolled up around the axis X (the retraction state as shown in FIG. 1C) or extension (the extension state as shown in FIG. 1B). As shown in FIG. 1A and FIG. 1B, the resilient substrate structure 1 defines a longitudinal direction Y perpendicular to the axis X at the extension state. As shown in FIG. 1C, the resilient substrate structure 1 defines a radial direction Z perpendicular to the axis X at the retraction state. To be noted, the axis X can be parallel to the long side or the diagonal thereof, or form any angle with the short side thereof. In other words, the resilient substrate structure 1 can be rolled in any direction to be at the retraction state. It can be understood that the resilient substrate structure 1 can define one or more axes X for the rolling up operation. In this embodiment, the axis X is parallel to the short side of the resilient substrate structure 1, the longitudinal direction Y is parallel to the long side of the resilient substrate structure 1 (the long side extends from the left side to the right side as shown in FIG. 1A), and the radial direction is the direction extending from the upper side to the lower side as shown in FIG. 1C. As shown in FIG. 1A, the axis X extends from the upper side to the lower side. As shown in FIGS. 1B and 1C, the axis X is in the direction entering the drawing.

The resilient substrate structure 1 includes a substrate 11, a working patterned layer 12 and a resilient structure 13. In this embodiment, the substrate 11 can be rollable at least around the axis X. The substrate 11 can be a single-layer substrate or a multilayer substrate. The multilayer substrate includes a composite substrate containing homogeneous or heterogeneous materials being combined in any manner. The substrate 11 defines a first surface S1 and a second surface S2 opposite to the first surface S1, and it further defines a first edge 11a and a second edge 11b, which are opposite to each other, in the direction parallel to the axis X. The working patterned layer 12 is arranged on the first surface S1 of the substrate 11, and the resilient structure 13 is arranged on the second surface S2 of the substrate 11. The working patterned layer 12 has at least one conductive trace. In this embodiment, resilient substrate structure 1 includes only one working patterned layer 12. As shown in FIGS. 1A to 1C, the working patterned layer 12 is a conductive circuit directly arranged on the first surface S1 of the substrate 11. In some embodiments, the working patterned layer 12 can be an active circuit or a passive circuit. In some embodiments, the resilient substrate structure 1 may include two or more working patterned layers 12, which are distributed in the substrate 11 or on the second surface S2 of the substrate 11. The above-mentioned substrate 11 can be made of, for example but not limited to, PI material, PET material, or any of other resilient materials, or it can be a composite substrate including the aforementioned materials. The resilient structure 13 is arranged on the second surface S2 of the substrate 11, and includes a composite layer 131 and a supporting layer 132. The composite layer 131 is located between the supporting layer 132 and the substrate 11, and the supporting layer 132 and the composite layer 131 keep attaching to each other at the retraction state and the extension state, and the transition therebetween. As shown in FIG. 1C, the resilient structure 13 defines a cross-sectional profile CS in the longitudinal direction Y When the resilient substrate structure 1 is at the retraction state, the cross-sectional profile CS of the resilient structure 13 contains a plurality of wavy segments. In addition, the composite layer 131 has a plurality of curve-able segments SS, each curve-able segment SS is in the direction parallel to the axis X, and each curve-able segment SS is connected to the first edge 11a and the second edge 11b of the substrate 11. Specifically, the resilient structure 13 is connected to the substrate 11, and the resilient structure 13 can generate multiple wavy segments, which can decrease the risk of separation or dislocation of two adjacent structures in the substrate 11, the composite layer 131 and the supporting layer 132. Accordingly, the stability of the relative relationship between the substrate 11 and the resilient structure 13 can be maintained.

In some embodiments, when the resilient substrate structure 1 is at the extension state, the tensile resistance of the supporting layer 132 in the longitudinal direction Y is greater than the tensile resistance of the working patterned layer 12 in the longitudinal direction Y That is, when the resilient substrate structure 1 is at the extension state, the force is applied to the resilient substrate structure 1 outwardly from two ends of the resilient substrate structure 1 in the longitudinal direction Y, and the supporting layer 132 has a larger tensile resistance in the longitudinal direction Y for resisting the applied force. Thus, the working patterned layer 12 can keep its original shape in the longitudinal direction Y without being stretched.

In some embodiments, when the resilient substrate structure 1 is at the retraction state, the bendability of the supporting layer 132 is greater than the bendability of the working patterned layer 12. That is, when the resilient substrate structure 1 is at the retraction state, a force is applied to the resilient substrate structure 1 around the axis X so as to roll up the resilient substrate structure 1. In this case, the supporting layer 132 has a larger bendability for resisting the applied force, so that the working patterned layer 12 can keep its original shape without being bent.

Figure 2A:
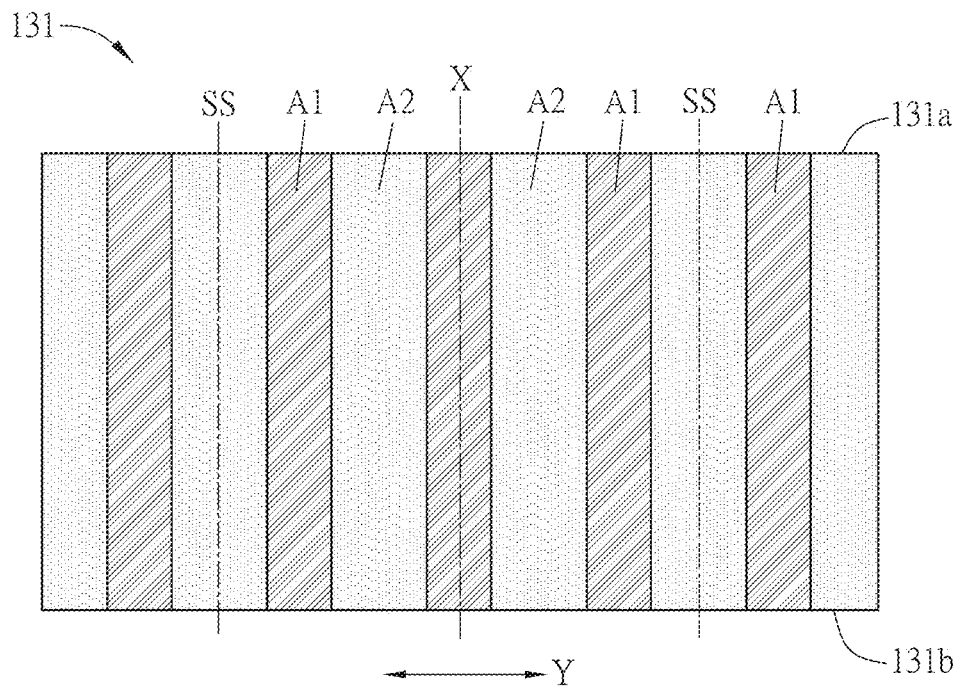
FIG. 2A is a schematic diagram showing a composite layer of the resilient substrate structure of FIG. 1A.
Figure 2B:
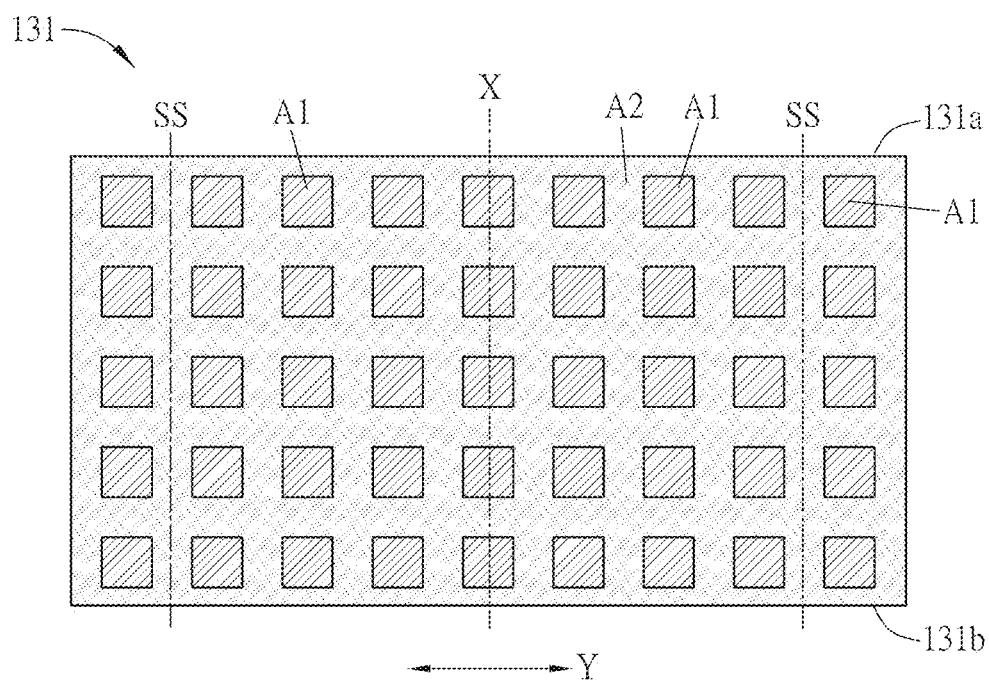
FIG. 2B is a schematic diagram showing a composite layer of a resilient substrate structure according to a second embodiment of this disclosure.
Figure 2C:
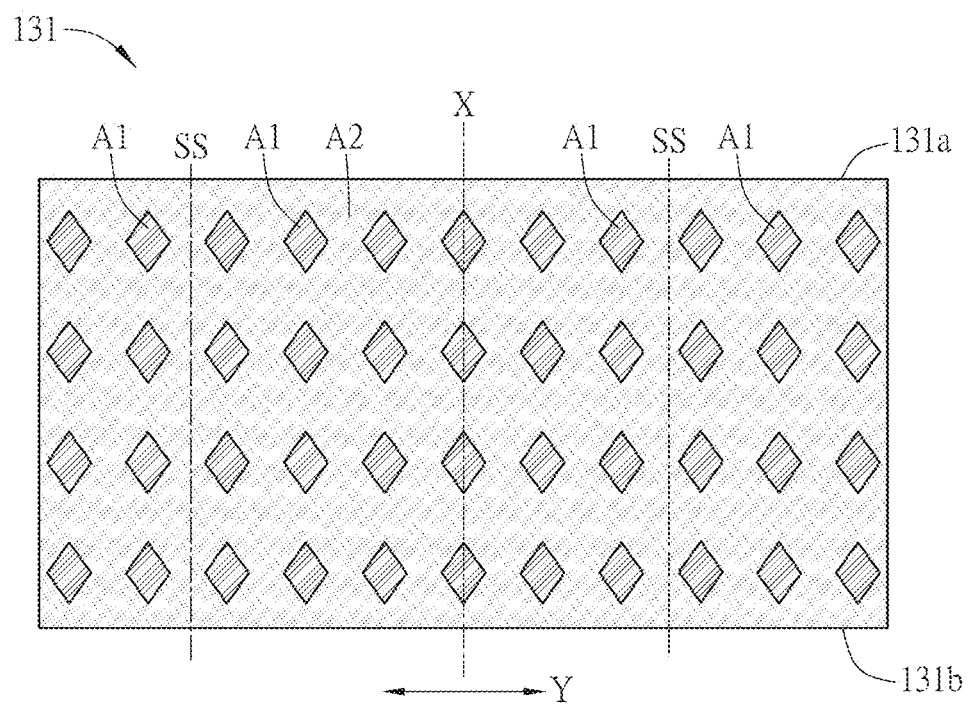
FIG. 2C is a schematic diagram showing a composite layer of a resilient substrate structure according to a third embodiment of this disclosure.
Figure 2D:
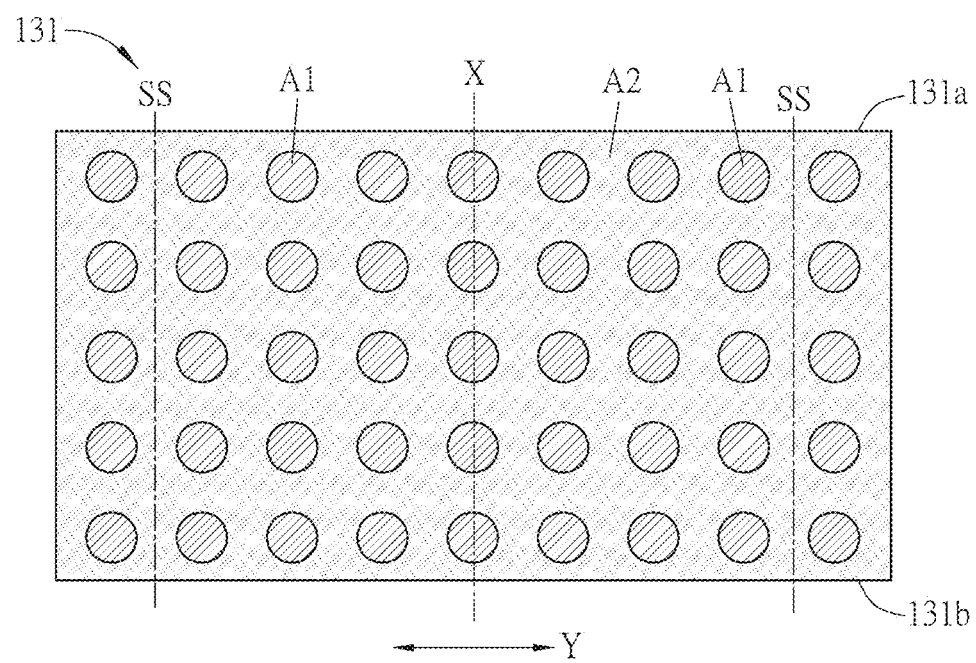
FIG. 2D is a schematic diagram showing a composite layer of a resilient substrate structure according to a fourth embodiment of this disclosure.

FIG. 2A is a schematic diagram showing a composite layer of the resilient substrate structure of FIG. 1A, FIG. 2B is a schematic diagram showing a composite layer of a resilient substrate structure according to a second embodiment of this disclosure, FIG. 2C is a schematic diagram showing a composite layer of a resilient substrate structure according to a third embodiment of this disclosure, and FIG. 2D is a schematic diagram showing a composite layer of a resilient substrate structure according to a fourth embodiment of this disclosure. Referring to FIGS. 2A to 2D, the composite layer 131 includes a plurality of weak-transform segments A1 and one or more strong-transform segments A2. To be noted, the shape of the cross-section of each of the strong-transform segments A2 is not limited, and the shape of the cross-section of each of the weak-transform segments A1 cam be optionally the same as that of the strong-transform segments A2 or can be not limited. The weak-transform segments A1 and the strong-transform segments A2 are arranged in the same layer in the second surface S2 of the substrate 11 and arranged in an alternate manner, and the weak-transform segments A1 are in a continual arrangement in the longitudinal direction Y Herein, the continual arrangement means that the weak-transform segments A1 do not contact one another. The shape and size of each weak-transform segment A1 and any the distance between any two adjacent weak-transform segments A1 can be adjusted, as long as the weak-transform segments A1 do not contact one another. It should be understood that each curve-able segment SS is at least partial of the one or more strong-transform segments A2. As shown in FIG. 1C, it can be seen from the cross-sectional profile CS of the resilient structure 13 that when the resilient substrate structure 1 is in the retraction state, the deformation of the weak-transform segments A1 in the radial direction Z is smaller than that of the strong-transform segments A2 in the radial direction Z. In FIG. 1C, the deformation of the strong-transform segments A2 in the radial direction Z is, for example but not limited to, convex. To be noted, the deformation of the strong-transform segments A2 in the radial direction Z can be concave (as shown in FIG. 1D). The deformation of the strong-transform segments A2 in the radial direction Z depends on the material properties. To be noted, with observing the composite layer 131 from the cross-sectional profile CS, the composite layer 131 contains a plurality of strong-transform segments A2, and two adjacent strong-transform segments A2 has one weak-transform segment A1 therebetween. That is, the weak-transform segments A1 and the strong-transform segments A2 are arranged alternately. Each curve-able segment SS is formed by the strong-transform segments A2 continuously arranged between the first edge 11a and the second edge 11b of the substrate 11. In addition, the strong-transform segments A2 has a recoverable force, and a part or all of the strong-transform segments A2 are contained in the curve-able segment SS. The curve-able segment SS can be deformed in the retraction state, so that the entire resilient substrate structure 1 can be rolled up around the axis X. When the resilient substrate structure 1 transforms to the extension state, the strong-transform segments A2 can return from the deformed shape to the original shape thereof.

In some embodiments, the weak-transform segments A1 define a thickness T. When the resilient substrate structure 1 is at the retraction state or the extension state, or at the transition state therebetween, the thickness T remains constant. In other words, compared with the strong-transform segments A2, the deformation of the weak-transform segments A1 caused by the external force is small, so the weak-transform segments A1 are relatively hard to obtain deformation. In different materials and their physical properties, the hardness of the weak-transform segments A1 may also be greater than that of the strong-transform segments A2, or the elasticity of the weak-transform segments A1 is smaller than that of the strong-transform segments A2.

In some embodiments, when the composite layer includes the above-mentioned composed structure, the strong-transform segments A2 can further cover or wrap the weak-transform segments A1. For example, the strong-transform segments A2 can cover the upper or lower surfaces of the weak-transform segments A1 or wrap it all; this configuration can also form a structure similar to the bamboo curtain effect. In this embodiment, the shape of the cross-section of the weak-transform segments A1 is not limited.

The different properties of the weak-transform segments A1 and the strong-transform segments A2 are caused by the difference in properties of their materials, which can be formed by the arrangements and combinations of at least two or more materials. In this embodiment, the composite layer 131 includes, for example, a first material and a second material. Each of the first material and the second material is defined with a viscoelasticity and a yield point. For example, when the viscoelasticity of the first material is less than the yield point of the first material, the viscoelasticity of the second material is less than the yield point of the second material, and the viscoelasticity of the first material is less than the viscoelasticity of the second material, the weak-transform segments A1 include the first material or include the first material and the second material, and the strong-transform segments A2 include the second material or include the first material and the second material. If both of the weak-transform segments A1 and the strong-transform segments A2 include the first material and the second material, by adjusting the ratio of the first and second materials, the deformation of the weak-transform segments A1 caused by the external force can be smaller than that of the strong-transform segments A2. Each of the first material and the second material can be, for example but not limited to, optical clear adhesive (OCA), cyclic olefin polymer (COP) resin, thermoplastic elastomer (TPE), polyethylene terephthalate (PET), polypropylene (PP), and any of other materials that can be used as an adhesive layer. In addition, the above-mentioned materials are not limited to organic materials. In addition to organic materials, the weak-transform segments A1 can be further defined as rigid high-strength fiber, metal, or an equivalent material with light weight, relatively better rigidity, or relatively lower elasticity.

FIG. 2A is a schematic diagram showing a composite layer of the resilient substrate structure of FIG. 1A. Referring to FIGS. 1A and 2A, the composite layer 131 has a first edge 131a and a second edge 131b opposite to the first edge 131a in a direction parallel to the axis X. In this embodiment, the composite layer 131 includes a plurality of weak-transform segments A1, the weak-transform segments A1 and the strong-transform segments A2 respectively extend from the first edge 131a to the second edge 131b, and the weak-transform segments A1 and the strong-transform segments A2 are arranged in a continual arrangement in the longitudinal direction Y Two adjacent strong-transform segments A2 is joined with one of the weak-transform segments A1 therebetween, and vice versa. In other words, the weak-transform segments A1 are arranged in parallel in the direction parallel to the axis X, and the strong-transform segments A2 are arranged in parallel in the direction parallel to the axis X. The weak-transform segments A1 and the strong-transform segments A2 are arranged in an interlace manner, so that the composite layer 131 is configured with a striped structure.

FIG. 2B is a schematic diagram showing a composite layer of a resilient substrate structure according to a second embodiment of this disclosure, FIG. 2C is a schematic diagram showing a composite layer of a resilient substrate structure according to a third embodiment of this disclosure, and FIG. 2D is a schematic diagram showing a composite layer of a resilient substrate structure according to a fourth embodiment of this disclosure. The component arrangements of the resilient substrate structures of the second to fourth embodiments are mostly the same as those of the previous embodiment, and the differences thereof are in the design of the composite layers. In these embodiments, the composite layer 131 has a first edge 131a and a second edge 131b opposite to the first edge 131a in a direction parallel to the axis X. Between the first edge 131a and the second edge 131b, there is one strong-transform segment A2, which is laid in the second surface of the substrate 11. The weak-transform segments A1 are in the continual arrangement in the direction parallel to the axis X, and they are still in the continual arrangement in the longitudinal direction Y The structure of the composite layer 131 is in a checkerboard shape (as shown in FIG. 2B), a rhombic shape (as shown in FIG. 2C) or a spherical shape (as shown in FIG. 2D). In these embodiments, the shape, size, position, and quantity of the weak-transform segments A1 are not limited, as long as they are in the continual arrangement in the direction parallel to the axis X (defined as a rolling axis) and the longitudinal direction Y (perpendicular to the rolling axis), so that the weak-transform segments A1 do not contact one another. It should be understood that since the amount of the axis X can be defined as one or more than one, the design can match the above rules at the same time by adjusting the configuration, arrangement direction, and quantity of these weak-transform segments A1, so that the resilient substrate structure 1 can be rolled up in different directions. In addition, the number of the weak-transform segments A1 is not limited. For example, the number of one row of the weak-transform segments A1 in the direction parallel to the axis X can be different from the number of the other row thereof, and these weak-transform segments A1 are still in the continual arrangement in the longitudinal direction Y, vice versa. In addition, although the second to fourth embodiments disclose that the weak-transform segments A1 independently in a continual arrangement, it is also possible to replace only part of the configuration of the weak-transform segments A1 with the first embodiment in the second to fourth embodiments mentioned above. This disclosure is not limited thereto.

Figure 3A:
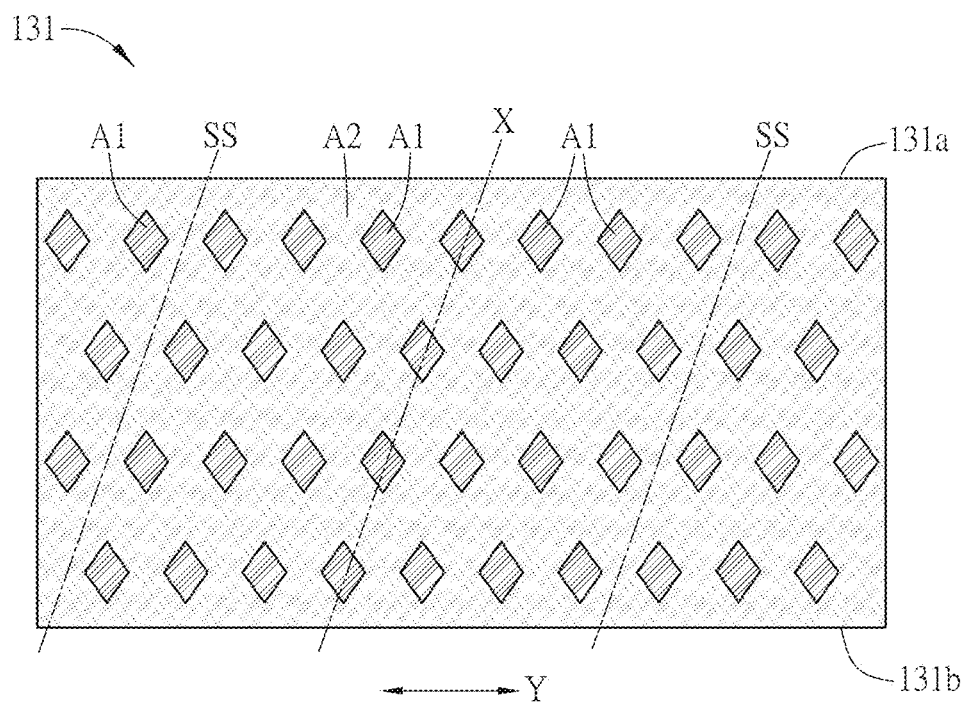
FIG. 3A is a schematic diagram showing a composite layer of a resilient substrate structure according to a fifth embodiment of this disclosure.
Figure 3B:
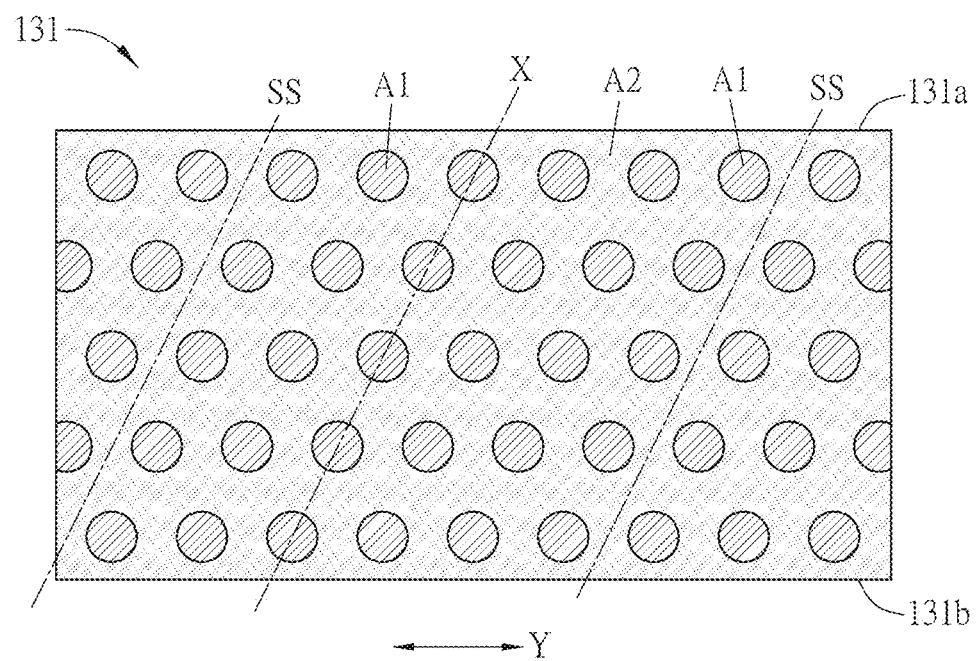
FIG. 3B is a schematic diagram showing a composite layer of a resilient substrate structure according to a sixth embodiment of this disclosure.

FIG. 3A is a schematic diagram showing a composite layer of a resilient substrate structure according to a fifth embodiment of this disclosure, and FIG. 3B is a schematic diagram showing a composite layer of a resilient substrate structure according to a sixth embodiment of this disclosure. Referring to FIGS. 3A and 3B, the weak-transform segments A1 in different rows are in a stagger arrangement, so that both the curve-able segments SS and the axis X are in the direction having an angle with the short axis of the composite layer 131, instead of being parallel to the short axis of the composite layer 131 as shown in FIGS. 2C and 2D.

In addition, although FIGS. 2B to 3B show that the weak-transform segments A1 on both sides of the composite layer 131 in the axis X are distributed symmetrically or/and evenly, the density and distribution positions of the weak-transform segments A1 are not limited thereto. For example, the weak-transform segments A1 of the composite layer 131 can be concentrated in the middle of the composite layer 131 and the four corners of the composite layer 131 have less weak-transform segments A1, or the weak-transform segments A1 of the composite layer 131 can be concentrated in the middle of the composite layer 131 and the four edges of the composite layer 131 have less weak-transform segments A1. Any configuration is acceptable as long as the resilient substrate structure 1 can be easily rolled up. Alternatively, the density of the weak-transform segments A1 of the composite layer 131 adjacent to either the first edge 11a or the second edge 11b of the substrate 11 is lower than that of the other end, or the density of the weak-transform segments A1 of the composite layer 131 adjacent to either the first edge 132a or the second edge 132b of the supporting layer 132 is lower than that of the other end. In addition, the density of the weak-transform segments A1 of the composite layer 131 in any end gradually increases toward the other end. It should be understood that the density can be measured on a section in a direction parallel to the axis X, and as mentioned above, the axis X can be parallel to the long side of the substrate 11, or parallel to the diagonal of the substrate 11, or form any angle with the short side of the substrate 11.

Figure 4:
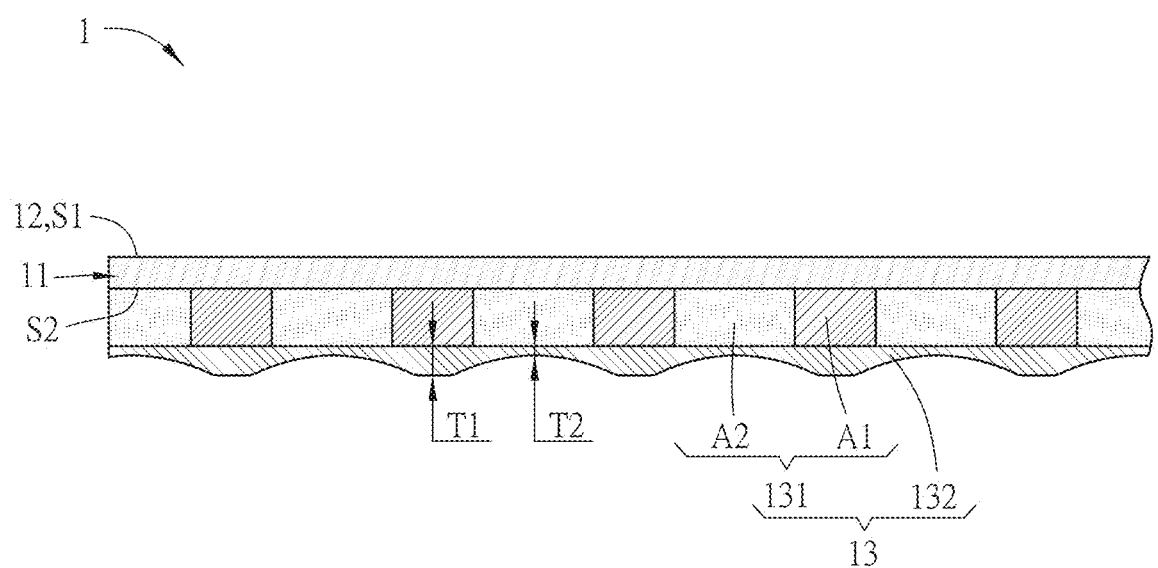
FIG. 4 is a schematic diagram showing a resilient substrate structure according to a seventh embodiment of this disclosure.

FIG. 4 is a schematic diagram showing a resilient substrate structure according to a seventh embodiment of this disclosure. The component arrangements of the resilient substrate structure of the seventh embodiment as shown in FIG. 4 are mostly the same as those of the previous embodiments, and the differences thereof are in the design of the supporting layers. In this embodiment, the supporting layer 132 defines a first thickness T1 corresponding to the weak-transform segments A1 of the composite layer 131 and a second thickness T2 corresponding to the strong-transform segments A2 of the composite layer 131. The first thickness T1 is greater than the second thickness T2, and the second thickness T2 is greater than zero. Specifically, the supporting layer 132 can be made of a uniform material, and the first thickness T1 corresponding to the weak-transform segments A1 can be adjusted to be relatively larger, while the second thickness T2 corresponding to the strong-transform segments A2 can be adjusted to be relatively smaller. The configuration of the larger first thickness T1 corresponding to the weak-transform segments A1 and the smaller second thickness T2 corresponding to the strong-transform segments A2 can make the part of the supporting layer 132 corresponding to the strong-transform segments A2 have higher adhesion or bendability. When the resilient substrate structure 1 is at the retraction state, the partial structure of the composite layer 13 having the weak-transform segments A1 and the thicker supporting layer 132 is not easily deformed. Thus, the thinner supporting layer 132 can remain attaching when the strong-transform segments A2 are deformed, thereby reducing the risk of structural separation or dislocation.

Figure 5A:
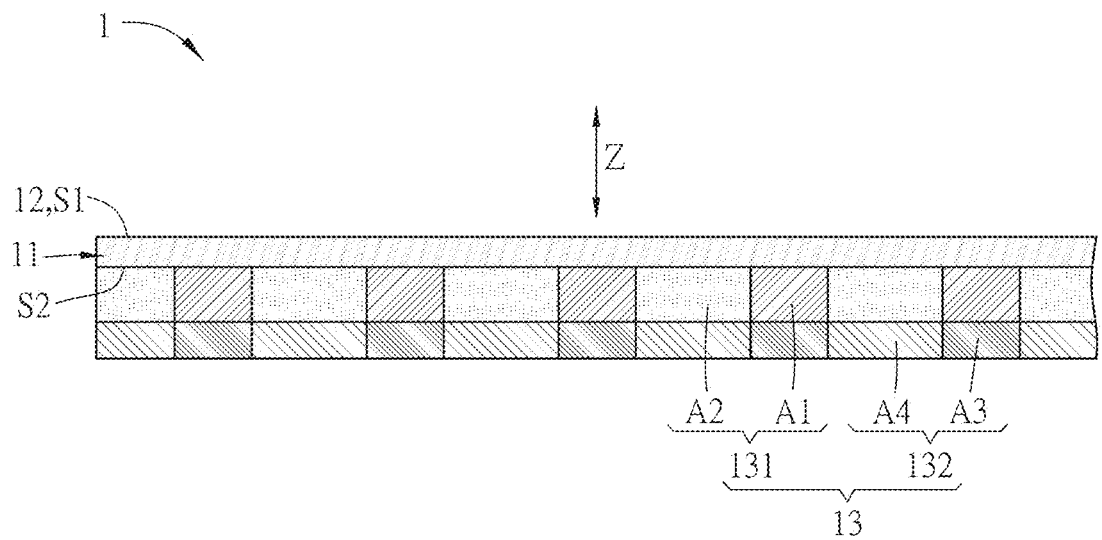
FIG. 5A is a schematic diagram showing a resilient substrate structure according to an eighth embodiment of this disclosure.
Figure 5B:
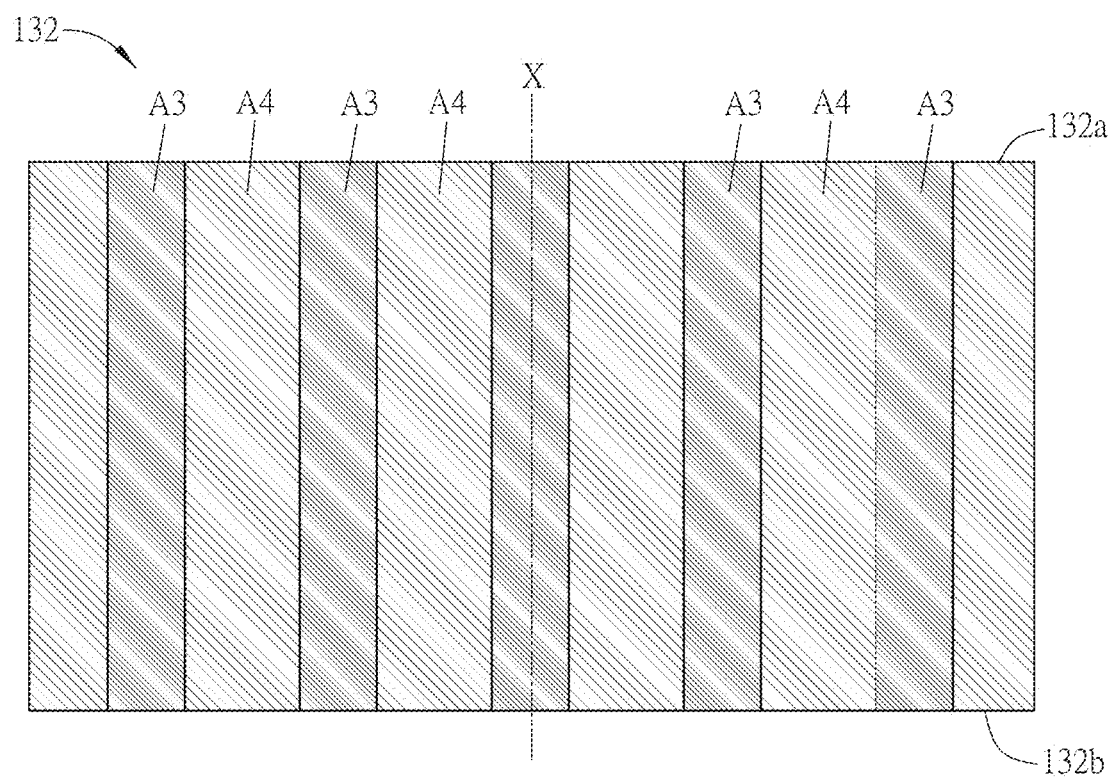
FIG. 5B is a schematic diagram showing a supporting layer of the resilient substrate structure of FIG. 5A.

FIG. 5A is a schematic diagram showing a resilient substrate structure according to an eighth embodiment of this disclosure, and FIG. 5B is a schematic diagram showing a supporting layer of the resilient substrate structure of FIG. 5A. The component arrangements of the resilient substrate structure of the eighth embodiment as shown in FIGS. 5A and 5B are mostly the same as those of the previous embodiments, and the differences thereof are in the design of the supporting layers. In this embodiment, the supporting layer 132 defines a plurality of weak-curveable segments A3 corresponding to the weak-transform segments A1 and a plurality of strong-curveable segments A4 corresponding to the strong-transform segments A2. When the resilient substrate structure 1 is at the retraction state, the bendability of the weak-curveable segments A3 is smaller than the bendability of the strong-curveable segments A4. The supporting layer 132 has a first edge 132a and a second edge 132b opposite to the first edge 132a in a direction parallel to the axis X. The weak-curveable segments A3 and the strong-curveable segments A4 extend from the first edge 132a to the second edge 132b. For example, as shown in FIG. 5B, the weak-curveable segments A3 may be arranged in parallel in the direction parallel to the axis X, and the strong-curveable segments A4 may be arranged in parallel in the direction parallel to the axis X. The weak-curveable segments A3 and the strong-curveable segments A4 are arranged in an interlace manner, so that the supporting layer 132 is configured with a striped structure. In some embodiments, the weak-curveable segments A3 and the strong-curveable segments A4 can be arranged corresponding to the configurations of the weak-transform segments A1 and the strong-transform segments A2 of the composite layer 131 in the second, third and fourth embodiments, so that the weak-curveable segments A3 can be arranged in a continual arrangement in the direction parallel to the axis X, and the strong-curveable segments A4 can be arranged in a continual arrangement in the direction parallel to the axis X. Therefore, the structure of the supporting layer 132 can be in a checkerboard shape (not shown, similar to the composite layer 131 as shown in FIG. 2B) or a rhombic shape (not shown, similar to the composite layer 131 as shown in FIG. 2C) or a spherical shape (not shown, similar to the composite layer 131 as shown in FIG. 2D). The above-mentioned embodiment can also be implemented based on the condition that the hardness of the weak-curveable segments A3 is greater than the hardness of the strong-curveable segments A4.

Figure 6A:
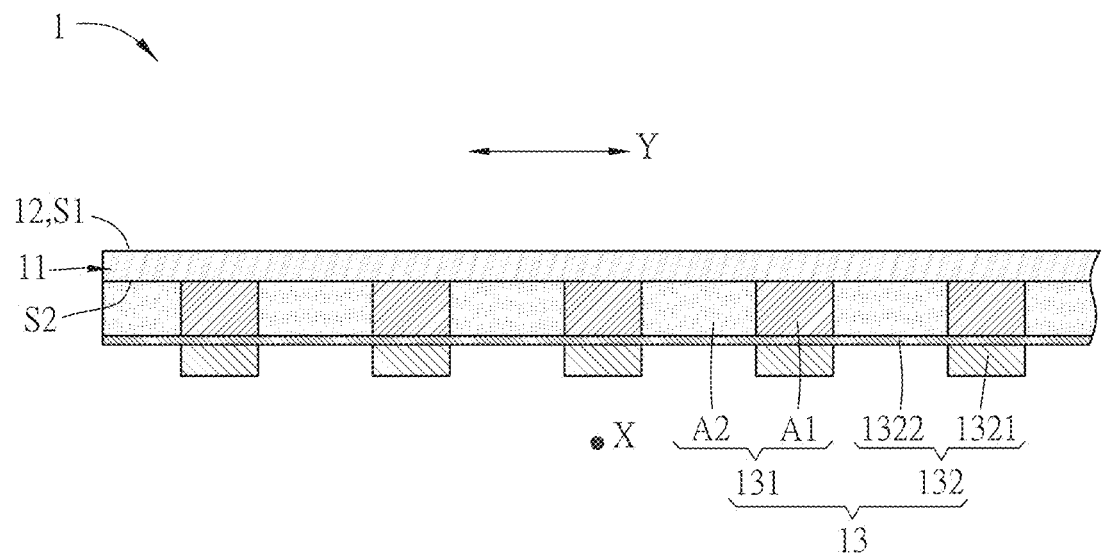
FIG. 6A is a schematic diagram showing a resilient substrate structure according to an ninth embodiment of this disclosure.
Figure 6B:
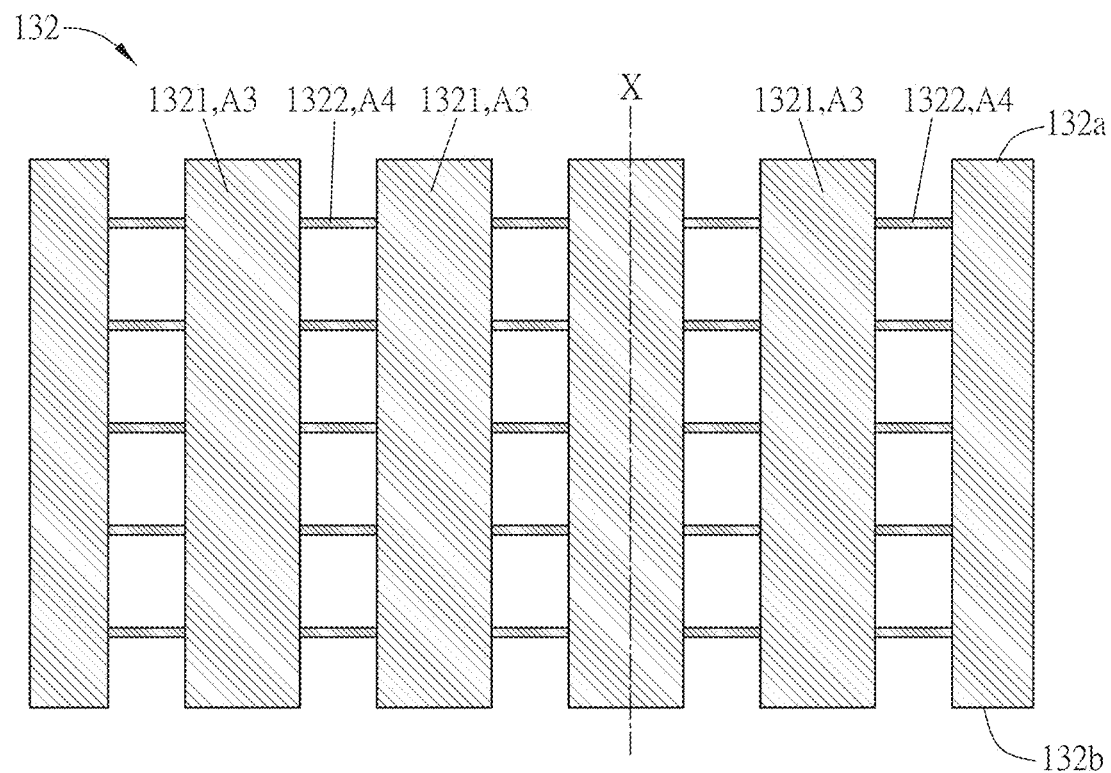
FIG. 6B is a schematic diagram showing a supporting layer of the resilient substrate structure of FIG. 6A.

FIG. 6A is a schematic diagram showing a resilient substrate structure according to a ninth embodiment of this disclosure, and FIG. 6B is a schematic diagram showing a supporting layer of the resilient substrate structure of FIG. 6A. The component arrangements of the resilient substrate structure of the ninth embodiment as shown in FIGS. 6A and 6B are mostly the same as those of the previous embodiments, and the differences thereof are in the design of the supporting layers. In this embodiment, the weak-curveable segments A3 of the supporting layer 132 are defined as a plurality of sustaining ribs 1321, and the strong-curveable segments A4 are defined as a plurality of sustaining wires 1322 connecting the sustaining ribs 1321. Specifically, the supporting layer 132 has a first edge 132a and a second edge 132b opposite to the first edge 132a in the direction parallel to the axis X, and the sustaining ribs 1321 extend from the first edge 132a to the second edge 132b. The sustaining wires 1322 are parallel to each other in the longitudinal direction Y, so that the supporting layer 132 forms a structure similar to a bamboo curtain. The sustaining ribs 1321 and the sustaining wires 1322 can be made of homogeneous or heterogeneous materials. For example, the sustaining ribs 1321 and the sustaining wires 1322 can be made of the same material, and the width of the sustaining ribs 1321 is greater than the width of the sustaining wires 1322, so the bendability of the sustaining wires 1322 is greater than that of the support ribs 1321. Alternatively, the sustaining ribs 1321 and the sustaining wires 1322 can be made of different materials, and the viscoelasticity of the material of the sustaining ribs 1321 is smaller than the viscoelasticity of the material of the sustaining wires 1322. In this case, the width of the sustaining ribs 1321 and the width of the sustaining wires 1322 may be the same or different, which is not limited as long as the bendability of the sustaining wires 1322 is greater than that of the sustaining ribs 1321. Herein, the shape of the cross-section of the supporting rib 1321 is not limited.

With reference to FIGS. 1A, 1C and 5B, the substrate 11 has a first edge 11a and a second edge 11b, which is opposite to the first edge 11a, in a direction parallel to the axis X. The supporting layer 132 has a first edge 132a and a second edge 132b, which is opposite to the first edge 132a, in the direction parallel to the axis X. When the resilient substrate structure 1 is at the retraction state, the first edge 132a of the supporting layer 132 is leveled with the first edge 11a of the substrate 11 in the radial direction Z, and the second edge 132b of the supporting layer 132 is leveled with the second edge 11b of the substrate 11 in the radial direction Z. In other words, when the resilient substrate structure 1 is at the retraction state, the substrate 11 and the supporting layer 132 are not dislocated with each other. That is, when the resilient substrate structure 1 is at the retraction state, the substrate 11 and the supporting layer 132 remain at the same relative positions in the direction parallel to the axis X.

In the above-mentioned embodiments, the material of the supporting layer 132 may include, for example but not limited to, non-woven fabric, steel wire, or any of other suitable materials. In this case, the supporting layer 132 includes non-woven fabric, which is a cloth-like object formed by pressing process or bonding with various fiber raw materials. The non-woven fabric may be, for example but not limited to, cellulose non-woven fabric, needle-punched non-woven fabric, melt-blown non-woven fabric, thermal bonded non-woven fabric, wet-laid non-woven fabric, chemically bonded non-woven fabric, or spun-bonded non-woven fabric. The material of the non-woven fabric can be, for example but not limited to, polypropylene (PP), polyethylene (PE), resin, or any of other suitable materials.

Figure 7:
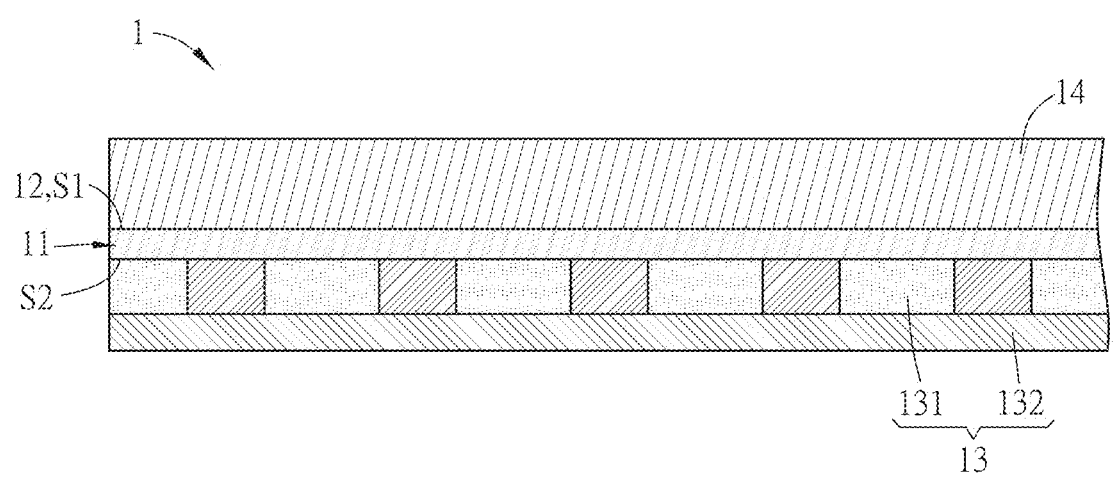
FIG. 7 is a schematic diagram showing a resilient substrate structure according to a tenth embodiment of this disclosure.

FIG. 7 is a schematic diagram showing a resilient substrate structure according to a tenth embodiment of this disclosure. Referring to FIG. 7, the resilient substrate structure 1 may further include a resilient layer 14 laid on the first surface S1 of the substrate 11 to cover the working patterned layer 12 and/or other structures or components arranged on the working patterned layer 12. The resilient layer 14 can be used as a protective layer to protect the structures or components on the working patterned layer 12 from the intrusion of environmental moisture or dusts, which would destroy their properties. The resilient layer 14 can be a light-transmitting layer or a structural layer made of any light-transmitting material. The material of the light-transmitting layer can include, for example, optical clear adhesive (OCA), optical clear resin (OCR). The light-transmitting material can include inorganic light-transmitting materials, light-transmitting polymer materials or light-transmitting composite materials, and this disclosure is not limited. The resilient layer 14 may be a stress regulating layer to keep the working patterned layer 12 at or close to the stress neutral axis (layer) of the resilient substrate structure 1. Specifically, after the resilient substrate structure 1 is rolled up and extension, the distance between any two points on the working patterned layer 12 in the direction parallel to the axis X or parallel to the longitudinal direction Y can remain constant or approach the same. In other words, the working patterned layer 12 can maintain its original shape when the resilient substrate structure 1 is at the retraction state, the extension state, or in a transition state therebetween. It should be noted that in the whole structure, the stress neutral axis (layer) can be adjusted through different materials or structural combinations, so that the stress neutral axis (layer) can be more than one axis (or one layer). The resilient layer 14 can be optionally applied to any of the axes (or layers), and the working patterned layer 12 can also be optionally implemented on any part of the substrate 11 other than the first surface S1 of the substrate 11.

The following embodiments are used to illustrate an electronic device including the aforementioned resilient substrate structure 1. The electronic device can be an active matrix (AM) electronic device or a passive matrix (PM) electronic device. In addition, the electronic device can be a detection device, a display device, or an antenna device.

Figure 8A:
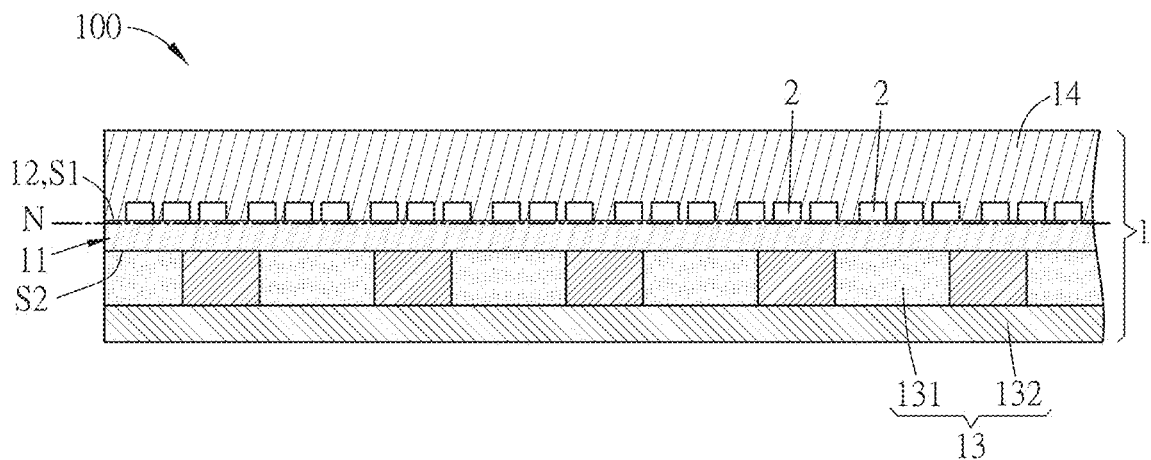
FIG. 8A is a schematic diagram showing an electronic device according to an embodiment of this disclosure.

FIG. 8A is a schematic diagram showing an electronic device according to an embodiment of this disclosure, FIG.

Figure 8B:
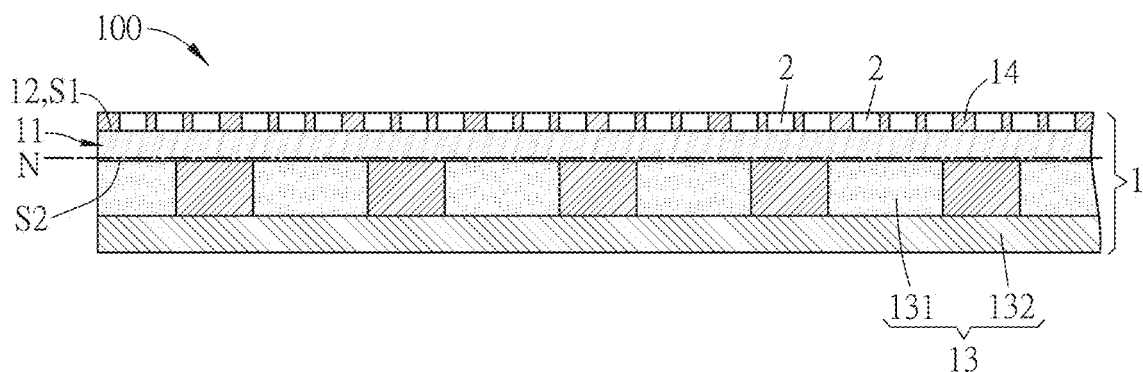
FIG. 8B is a schematic diagram showing an electronic device according to another embodiment of this disclosure.
Figure 8C:
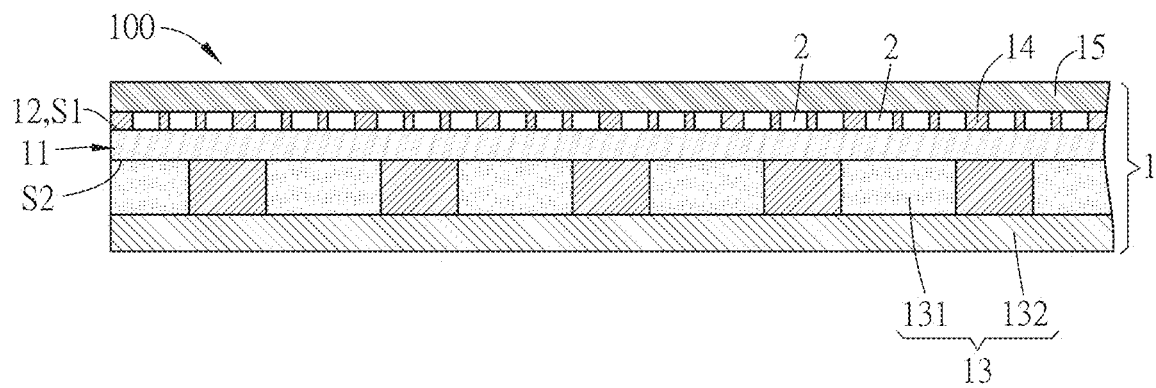
FIG. 8C is a schematic diagram showing an electronic device according to another embodiment of this disclosure.

8B is a schematic diagram showing an electronic device according to another embodiment of this disclosure, and FIG. 8C is a schematic diagram showing an electronic device according to another embodiment of this disclosure. In these embodiments, the electronic device 100 includes the above-mentioned resilient substrate structure 1 and a plurality of electronic elements 2, which are arranged on the first surface S1 of the substrate 11. The electronic elements 2 can be electrically connected to the working patterned layer 12.

The electronic component 2 can be a chip or a package, such as a chip or a package of millimeter scale, micrometer scale or nanometer scale. For example, the electronic component 2 may include, for example but not limited to, at least one detection chip, LED chip, Mini chip or Micro chip. In addition, the electronic component 2 may include at least one package, which may include a chip of millimeter scale, micrometer scale, nanometer scale or smaller. The millimeter-scale package may include a micrometer-scale chip. In another case, the package may include a chiplet with logic operation function, and the size of the chiplet is not limited. In addition, the electronic component 2 may include a self-luminous diode component, a diode component, a sensing component, an antenna component or a microwave component. In some embodiments, the electronic component 2 may include a chip with horizontal electrodes, flip-chip electrodes, or vertical electrodes. In some embodiments, electronic component 2 may include an active circuit or a passive circuit. The aforementioned package can be, for example but not limited to, a package containing active components or a passive package without an active component. The active component can be, for example but not limited to, a thin-film transistor (TFT), a non-silicon IC, or a silicon IC. The electronic device 100 may further include one or more active components corresponding to the above-mentioned electronic components 2 for driving the electronic components 2 to operate accordingly. In this embodiment, the above-mentioned driving elements can be arranged on the first surface S1 or the second surface S2 of the substrate 11, and this disclosure is not limited there to.

In some embodiments, as shown in FIG. 8A, the resilient layer 14 can completely cover the electronic components 2. As shown in FIG. 8B, the resilient layer 14 can cover at least a part of each electronic component 2. For example, the resilient layer 14 only covers the sides of the electronic components but does not cover the tops of the electronic components 2. In some embodiments, as shown in FIG. 8C, the electronic device 100 may further include a protective layer 15 stacked on the resilient layer 14 (as well as the electronic components 2).

The resilient layer 14 may function as a stress regulating layer to remain the working patterned layer 12 at or close to the stress neutral axis (layer) of the resilient substrate structure 1. For example, in some embodiments, as shown in FIG. 8A, the stress neutral axis (layer) N is located on the first surface S1 of the substrate 11, so that the working patterned layer 12 is located on the stress neutral axis (layer) N. In some embodiments, as shown in FIG. 8B, the stress neutral axis (layer) N is located on the second surface S2 of the substrate 11, so that the working patterned layer 12 is close to the stress neutral axis (layer) N. In addition, it should be understood that, the effect of self-stress regulation can also be achieved by setting the thickness of the substrate 11 and the position of the working patterned layer 12 on the substrate 11, so that the resilient layer 14 is not needed. In addition, the number of the stress neutral axis (layer) N can be more than one, and in addition to the resilient layer 14, it can further include other stress regulating layers. This disclosure is not limited thereto as long as the working patterned layer 12 and the electronic components 2 are located at or close to any stress neutral axis (layer) N. Therefore, the working patterned layer 12 and the electronic components 2 can be arranged in the substrate 11 or on the first surface S1 or the second surface S2 of the substrate 11 according to the aforementioned stress neutral axis (layer) N, and the number of the working patterned layer 12 is limited to a single layer. In addition, the working patterned layer 12 and the electronic components 2 are not limited to be located on the same stress neutral axis (layer) N.

The protective layer 15 can also be a light-transmitting layer, and the material thereof can include, for example, optical clear adhesive (OCA) or optical clear resin (OCR), or a structural layer made of other light-transmitting materials. The light-transmitting material can include inorganic light-transmitting materials, light-transmitting polymer materials or light-transmitting composite materials, and this disclosure is not limited. The material of the protective layer 15 may be completely the same as, partly the same as, or completely different from the resilient layer 14.

Figure 9:
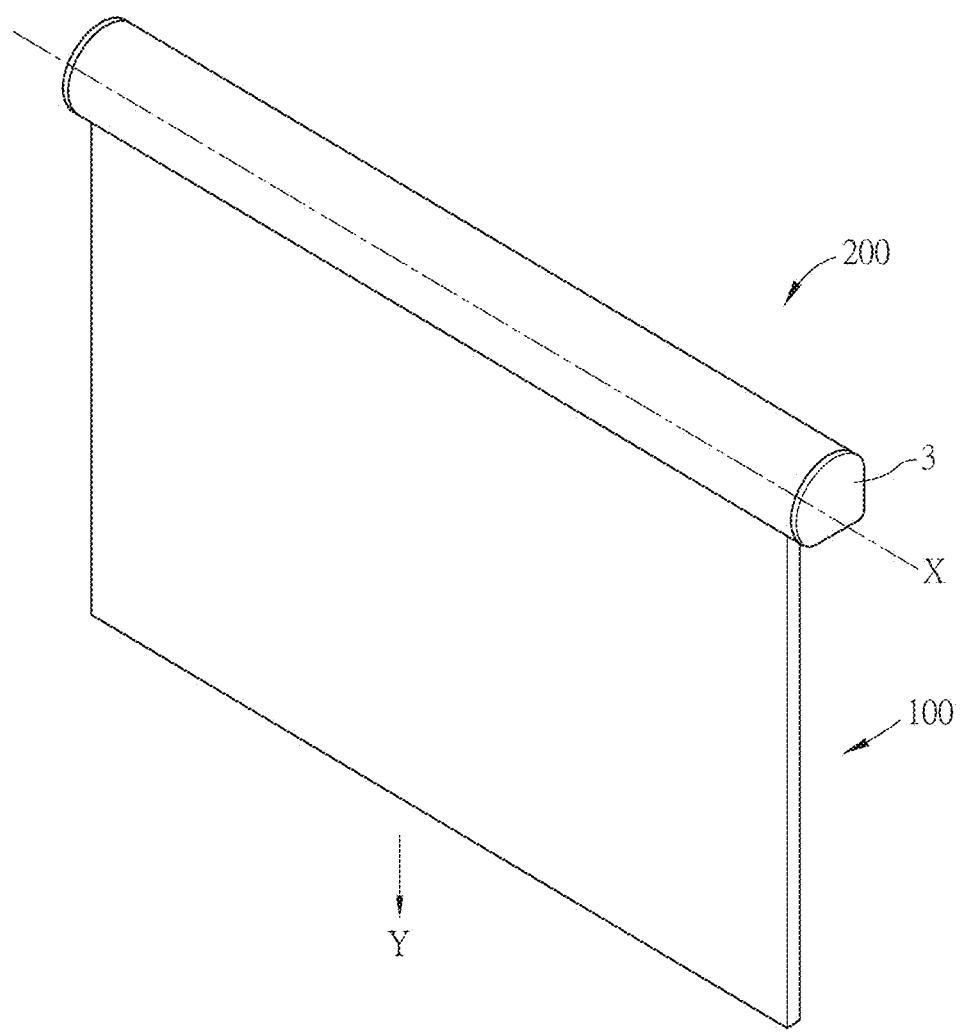
FIG. 9 is a schematic diagram showing an electronic device according to another embodiment of this disclosure.

FIG. 9 is a schematic diagram showing an electronic device according to another embodiment of this disclosure. Referring to FIG. 9, an electronic device 200 includes the above-mentioned electronic device 100 and an accommodating structure 3 for receiving the electronic device 100. The accommodating structure 3 extends in the axis X, and the electronic device 100 can be rolled up around the axis X. The resilient substrate structure 1 of the electronic device 100 defines a longitudinal direction Y perpendicular to the axis X in the extension state. When the electronic device 100 is rolled up around the axis X, it can be partially or completely accommodated in the accommodating structure 3.

In general, the resilient substrate structure of another embodiment of this disclosure includes a substrate, a working patterned layer and a resilient structure. The resilient substrate structure is rollable around an axis, configured to extend from or retract onto the axis, and rolls between a retraction state and an extension state. The resilient substrate structure defines a longitudinal direction perpendicular to the axis while rolls in the extension state, and defines a radial direction perpendicular to the axis while rolls in the retraction state. The substrate has a first surface and a second surface opposite to each other. The substrate is defined with a first edge and a second edge in a direction parallel to the axis, and the second edge is opposite to the first edge. The working patterned layer is arranged on the substrate, and it can be located on, for example but not limited to the first surface, the second surface or any position of the substrate. The resilient structure is arranged on the second surface of the substrate. The resilient structure includes a supporting layer and a composite layer located between the supporting layer and the substrate. The composite layer and the supporting layer keep attaching to each other. The structure of the composite layer can be any of the above-mentioned embodiments or aspects. The supporting layer can be made of a single material or multiple materials defined with a non-linear elastic coefficient.

In this embodiment, a first time point is defined as the resilient substrate structure is at the retraction state, such as fully-retraction position, and a second time point is defined as the resilient substrate structure is at the extension state, such as fully-extension position. The resilient structure defines a minimum anti-deformation stress in the longitudinal direction at the first time point, and a maximum anti-deformation stress in the longitudinal direction at the second time point. The supporting layer covers any of the above-mentioned various aspects. In another case, when the resilient substrate structure is at the extension state, the supporting layer is of a stress shrunk in the longitudinal direction, and when the resilient substrate structure is at the retraction state, the supporting layer is of a stress released in the longitudinal direction. In other words, when the resilient substrate structure is at the extension state, the supporting layer endures the stress shrunk in the longitudinal direction to balance with the composite layer sagged, due to the supporting layer being pre-stretched. On the contrary, when the resilient substrate structure is at the retraction state, the supporting layer releases the stress. For example, the supporting layer can be a longitude-latitude woven structure. In the longitude-latitude woven structure, an interval is defined between two adjacent longitudinal lines or between two adjacent latitudinal lines, and the interval in the case of extension sate is greater than the interval in the case of retraction state. Therefore, the above-mentioned resilient substrate structure is integrated in the resilient substrate structure applicable to the electronic device. For example, various electronic components can be arranged on the above-mentioned resilient substrate structure, or any of the above-mentioned aspects can be applied. It should be noted that when the supporting layer is a longitude-latitude woven structure, the cross-section of the resilient structure may or may not generate the wavy segments. In addition, when the supporting layer is in a pre-stretched state as the resilient substrate structure is at the extension state, the configuration of the supporting layer can be diversified. In addition to the configuration that the supporting layer is entirely attached to the composite layer, the supporting layer can also be configured with a plurality of sustaining wires 1322 as described in the ninth embodiment. To be noted, the supporting layer can be in any equivalent configuration that can achieve the pre-stretching effect.

In the resilient substrate structure according to another embodiment of this disclosure, extending from FIGS. 6A and 6B, the supporting layer (not shown) may further include a resilient covering layer, which can cover the sustaining ribs 1321 at the same time. In this case, the resilient covering layer can cover at least one side of the sustaining ribs 1321, or two sides of the sustaining ribs 1321. It can be understood that when the resilient covering layer covers at least one side of the sustaining ribs 1321, it can optionally cover/wrap or not cover/wrap the sustaining wires 1322. In addition, when the resilient covering layer covers two sides of the sustaining ribs 1321 at the same time, it can reasonably cover the sustaining wires 1322.

In the resilient substrate structure according to another embodiment of this disclosure, also extending from FIGS. 6A and 6B, the supporting layer (not shown) may further include a resilient covering layer, which can cover the sustaining ribs 1321 at the same time. In this case, the resilient covering layer can cover/wrap at least one side of the sustaining ribs 1321, or two sides of the sustaining ribs 1321. In this embodiment, no supporting wire 1322 is configured.

In the resilient substrate structure according to another embodiment of this disclosure, with reference to FIGS. 6A and 6B, the resilient substrate structure may not include the composite layer, and the supporting layer (not shown) may further include a resilient covering layer. In other words, the feature with the non-linear elastic coefficient, is applied to the resilient structure, no matter applicable to the supporting layer or the composite layer. To be noted, the resilient structure could merely be either one of the supporting layer or the composite layer in the case of applying with the non-linear elastic coefficient. The above-mentioned aspects relating to the resilient covering layer can be applied to this embodiment.

In summary, the resilient substrate structure of this disclosure includes a resilient structure, which has a specific design. Accordingly, the resilient substrate structure and the electronic device including the same have good structural stability and still maintain the bendability, so that the risk of structural separation or dislocation thereof can be reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

While the disclosure has been described by way of example and in terms of embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resilient substrate structure, which is rollable around an axis, is configured to extend from or retract onto the axis, and rolls between a retraction state and an extension state; the resilient substrate structure defining a longitudinal direction perpendicular to the axis while rolls in the extension state, the resilient substrate structure defining a radial direction perpendicular to the axis while rolls in the retraction state, the resilient substrate structure comprising:
a substrate having a first surface and a second surface opposite to each other, wherein the substrate is defined with a first edge and a second edge in a direction parallel to the axis, and the second edge is opposite to the first edge;
a working patterned layer arranged on the substrate; and
a resilient structure arranged on the second surface of the substrate;
wherein, the resilient structure defines a cross-sectional profile in the longitudinal direction, and the cross-sectional profile of the resilient structure defines a plurality of wavy segments, while the resilient substrate structure rolls in the retraction state.

2. The resilient substrate structure of claim 1, wherein the resilient structure includes a supporting layer and a composite layer kept attaching to each other, in which the composite layer locates between the supporting layer and the substrate.

3. The resilient substrate structure of claim 2, wherein the composite layer defines a plurality of weak-transform segments and one or more strong-transform segments interlacing the weak-transform segments, the weak-transform segments and the one or more strong-transform segments are arranged in co-layer on the second surface of the substrate, and the weak-transform segments are in a continual arrangement in the longitudinal direction.

4. The resilient substrate structure of claim 2, wherein the composite layer includes a first material and a second material, each of the first material and the second material is defined with a viscoelasticity and a yield point, the viscoelasticity of the first material is less than the yield point of the first material, the viscoelasticity of the second material is less than the yield point of the second material, the viscoelasticity of the first material is less than the viscoelasticity of the second material, the weak-transform segments include the first material or include the first material and the second material, and the strong-transform segments include the second material or include the first material and the second material.

5. The resilient substrate structure of claim 2, wherein a tensile resistance of the supporting layer in the longitudinal direction is greater than a tensile resistance of the working patterned layer in the longitudinal direction while the resilient substrate structure rolls in the extension state.

6. The resilient substrate structure of claim 2, wherein a bendability of the supporting layer is greater than a bendability of the working patterned layer.

7. The resilient substrate structure of claim 2, wherein the supporting layer is defined with a plurality of weak-curveable segments corresponding to the weak-transform segments and one or more strong-curveable segments corresponding to the one or more strong-transform segments, and a bendability of the weak-curveable segments is less than a bendability of the one or more strong-curveable segments.

8. The resilient substrate structure of claim 7, wherein the weak-curveable segments are a plurality of sustaining ribs, the one or more strong-curveable segments include a plurality of sustaining wires connecting the sustaining ribs, and a bendability of the sustaining wires is greater than a bendability of the sustaining ribs.

9. The resilient substrate structure of claim 2, wherein the supporting layer defines a non-linear elastic coefficient.

10. The resilient substrate structure of claim 1, wherein the resilient structure has a plurality of curve-able segments while rolls in the retraction state, and each of the curve-able segments is parallel to the axis and extend from the first edge to the second edge of the substrate.

11. The resilient substrate structure of claim 1, further comprising a resilient layer connected to the first surface of the substrate.

12. The resilient substrate structure of claim 1, wherein the working patterned layer is located at or close to a stress neutral axis of the resilient substrate structure.

13. An electronic device, comprising:
a plurality of electronic elements; and
the resilient substrate structure of claim 1, wherein the electronic elements are arranged on the substrate and electrically connected to the working patterned layer.

14. A resilient substrate structure, which is rollable around an axis, is configured to extend from or retract onto the axis, and rolls between a retraction state and an extension state; the resilient substrate structure defining a longitudinal direction perpendicular to the axis while rolls in the extension state, the resilient substrate structure defining a radial direction perpendicular to the axis while rolls in the retraction state, the resilient substrate structure comprising:
a substrate having a first surface and a second surface opposite to each other, wherein the substrate is defined with a first edge and a second edge in a direction parallel to the axis, and the second edge is opposite to the first edge;
a working patterned layer arranged on the substrate; and
a resilient structure arranged on the second surface of the substrate;
wherein the resilient structure includes a supporting layer and a composite layer kept attaching to each other, in which the composite layer locates between the supporting layer and the substrate, and the supporting layer defines a non-linear elastic coefficient.

15. The resilient substrate structure of claim 14, wherein the supporting layer defines a stress shrunk in the longitudinal direction while the resilient substrate structure rolls in the extension state, and the supporting layer has a stress released in the longitudinal direction while the resilient substrate structure rolls in the retraction state.

16. An electronic device, comprising:
a plurality of electronic elements; and
the resilient substrate structure of claim 14, wherein the electronic elements are arranged on the substrate and electrically connected to the working patterned layer.

17. A resilient substrate structure, which is rollable around an axis, is configured to extend from or retract onto the axis, and rolls between a retraction state and an extension state; the resilient substrate structure defining a longitudinal direction perpendicular to the axis while rolls in the extension state, the resilient substrate structure defining a radial direction perpendicular to the axis while rolls in the retraction state, the resilient substrate structure comprising:
a substrate having a first surface and a second surface opposite to each other, wherein the substrate is defined with a first edge and a second edge in a direction parallel to the axis, and the second edge is opposite to the first edge;
a working patterned layer arranged on the substrate; and
a resilient structure arranged on the second surface of the substrate, and defines a non-linear elastic coefficient.

18. The resilient substrate structure of claim 17, wherein the resilient structure defines a stress shrunk in the longitudinal direction while the resilient substrate structure rolls in the extension state, and the resilient structure has a stress released in the longitudinal direction while the resilient substrate structure rolls in the retraction state.

19. An electronic device, comprising:
a plurality of electronic elements; and
the resilient substrate structure of claim 17, wherein the electronic elements are arranged on the substrate and electrically connected to the working patterned layer.

* * * * *